United States Patent
Ramaswamy

(10) Patent No.: US 10,687,062 B1
(45) Date of Patent: Jun. 16, 2020

(54) COMPRESSION ACROSS MULTIPLE IMAGES

(71) Applicant: Google LLC, Mountain View, CA (US)

(72) Inventor: Sharadh Ramaswamy, Newark, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/282,418

(22) Filed: Feb. 22, 2019

(51) Int. Cl.
*H04N 11/02* (2006.01)
*H04N 19/13* (2014.01)
*H04N 19/124* (2014.01)
*H04N 19/176* (2014.01)
*G06F 9/54* (2006.01)
*H04N 19/625* (2014.01)

(52) U.S. Cl.
CPC ............. *H04N 19/13* (2014.11); *G06F 9/542* (2013.01); *H04N 19/124* (2014.11); *H04N 19/176* (2014.11); *H04N 19/625* (2014.11)

(58) Field of Classification Search
CPC ....................................................... H04N 19/13
USPC ....................................... 375/240.01–240.29
See application file for complete search history.

(56) References Cited

U.S. PATENT DOCUMENTS

| | | | |
|---|---|---|---|
| 5,157,488 A * | 10/1992 | Pennebaker | ......... H04N 19/593 375/240.04 |
| 5,333,212 A | 7/1994 | Ligtenberg | |
| 5,398,066 A | 3/1995 | Martinez-Uriegas et al. | |
| 5,471,207 A * | 11/1995 | Zandi | .................. H03M 7/4006 341/107 |
| 5,552,832 A * | 9/1996 | Astle | ..................... H04N 19/176 375/240.24 |
| 5,682,152 A | 10/1997 | Wang et al. | |
| 6,049,630 A | 4/2000 | Wang et al. | |
| 6,314,208 B1 | 11/2001 | Konstantinides et al. | |
| 6,701,020 B2 | 3/2004 | Chrysafis et al. | |
| 7,884,742 B2 | 2/2011 | Puri et al. | |
| 9,344,114 B1 | 5/2016 | Milner et al. | |
| 10,303,402 B2 * | 5/2019 | Xie | ....................... G06F 3/0656 |
| 2003/0091242 A1 * | 5/2003 | Kakarala | ................. H04N 19/46 382/239 |
| 2005/0053151 A1 * | 3/2005 | Lin | ......................... H04N 19/52 375/240.23 |
| 2017/0063392 A1 * | 3/2017 | Kalevo | ................... H04N 19/91 |

FOREIGN PATENT DOCUMENTS

| | | |
|---|---|---|
| CN | 101778284 A | 7/2010 |
| CN | 102647541 B | 8/2014 |

* cited by examiner

*Primary Examiner* — Leron Beck
(74) *Attorney, Agent, or Firm* — Honigman LLP; Brett A. Krueger

(57) ABSTRACT

A method for compression across multiple images is provided. The method includes receiving a plurality of images at a storage device. For each image of the plurality of images, the method includes generating codewords using lossy compression, each codeword defined as a bit string. The method further includes generating an entropy coding table based on the codewords generated for each image of the plurality of images and entropy encoding the plurality of images using the generated entropy coding table.

24 Claims, 5 Drawing Sheets

US 10,687,062 B1

COMPRESSION ACROSS MULTIPLE IMAGES

TECHNICAL FIELD

This disclosure relates to compression across multiple images.

BACKGROUND

Today, technology enables people to generate media content (e.g., images and videos) essentially anywhere. For instance, mobile devices often come standard with cameras that allow people to take photos or video their experiences. With the ease of this technology and the popularity of social media platforms, people may be compelled to generate media content to capture memories or to share moments. As people increase the amount of media content they generate, storage space is often needed as a repository to store the media content. Consequently, remote servers and backup storage functions have become commonly accessible to meet some of these storage demands. Yet as the demand continues to increase, storage devices need to improve storage efficiency and/or media storage techniques.

SUMMARY

One aspect of the disclosure provides a method for compression across multiple images. The method includes receiving, at data processing hardware, a plurality of images at a storage device. For each image of the plurality of images, the method also include generating, by the data processing hardware, codewords using lossy compression, each codeword defined as a bit string. The method further includes generating, by the data processing hardware, an entropy coding table based on the codewords of the plurality of images. The method also includes entropy encoding, by the data processing hardware, the plurality of images according to the generated entropy coding table.

Implementations of the disclosure may include one or more of the following optional features. In some implementations, generating codewords includes dividing each image of the plurality of images into pixel blocks, transforming each pixel block into transform coefficients, quantizing the transform coefficients to form quantization indices, representing each quantization index as a respective bit string, and assigning a variable-length code to the respective bit string. Here, the variable-length code includes a length of bits that decreases when an occurrence of the respective bit string increases within the plurality of images. The transform coefficients may include discrete cosine transform (DCT) coefficients. Each codeword may be a fixed-length bit string of quantized transform coefficients. The lossy compression may be Joint Photographic Experts Group (JPEG) compression.

In some examples, generating the entropy encoding table includes compiling the codewords by frequency of occurrence and assigning each codeword a variable-length code of bits based on the compiled frequencies of the codewords. For instance, the frequency of occurrence indicates a number of times each codeword exists in the plurality of images. Here, a first variable-length code may be assigned to a first codeword and a second variable-length code may be assigned to a second codeword. The first variable-length code may include less bits than the second variable-length code. The first codeword may include a greater frequency of occurrence than the second codeword. In some implementations, assigning the variable-length code of bits to each compiled codeword based on the frequencies of occurrence of the codewords includes optimizing a sum of the variable-length code of bits for all of the compiled codewords.

In some configurations, the storage device includes a remote server of a distributed system communicating with a user device. Receiving the plurality of images may occur in response to an upload from a user device, the upload associated with a backup functionality for media content of the user device. The received plurality of images may include a high-quality format and entropy encoding the plurality of images may compress the received plurality of images into a lower-storage footprint format.

In some examples, each image of the plurality of images has a common characteristic where the common characteristic is associated with a particular user, user account, media content album, or physical storage location. Receiving the plurality of images may include receiving media content including the plurality of images and another plurality of images for storage at the storage device and determining that the plurality of images has a common characteristic where the common characteristic is associated with a particular user, user account, media content album, or physical storage location. Additionally or alternatively, the method may further include storing the plurality of images entropy encoded using the generated entropy coding table in a separate location from the other plurality of images at the storage device.

Optionally, receiving the plurality of images includes detecting a creation or a receipt of media content at a user device running a storage application communicating with the storage device and generating a prompt for the user device where the prompt inquires whether a use of the user device wants to backup or to transfer the detected media content to the storage device. When the user selects to backup or to transfer the detected media content to the storage device, the method includes identifying the plurality of images within the media content for entropy encoding.

In some examples, the plurality of images corresponds to a first subset of images from an upload of media content by a user device. Here, the upload of media content includes the first subset of images and a second subset of images. The first subset of images has a first media content format designated for compression into a lower-storage footprint format. The second subset of images bypasses compression into the lower-storage footprint format.

Another aspect of the disclosure provides a system for compression across multiple images. The system includes data processing hardware and memory hardware in communication with the data processing hardware. The memory hardware stores instructions that when executed on the data processing hardware cause the data processing hardware to perform operations. The operations include receiving a plurality of images at a storage device. For each image of the plurality of images, the operations also include generating codewords using lossy compression, each codeword defined as a bit string. The operations further include generating an entropy coding table based on the codewords of the plurality of images and entropy encoding the plurality of images according to the generated entropy coding table.

This aspect may include one or more of the following optional features. In some implementations, the operation of generating codewords includes dividing each image of the plurality of images into pixel blocks, transforming each pixel block into transform coefficients, quantizing the transform coefficients to form quantization indices, representing each quantization index as a respective bit string, and assigning a variable-length code to the respective bit string. Here, the variable-length code includes a length of bits that decreases when an occurrence of the respective bit string increase within the plurality of images. The transform coefficients may include discrete cosine transform (DCT) coefficients. Each codeword may be a fixed-length bit string of quantized transform coefficients. The lossy compression may be Joint Photographic Experts Group (JPEG) compression.

In some examples, the operation of generating the entropy encoding table includes compiling the codewords by frequency of occurrence and assigning each codeword a variable-length code of bits based on the compiled frequencies of the codewords. For instance, the frequency of occurrence indicates a number of times each codeword exists in the plurality of images. Here, a first variable-length code may be assigned to a first codeword and a second variable-length code may be assigned to a second codeword. The first variable-length code may include less bits than the second variable-length code and the first codeword may include a greater frequency of occurrence than the second codeword. In some implementations, assigning the variable-length code of bits to each compiled codeword based on the frequencies of occurrence of the codewords includes optimizing a sum of the variable-length code of bits for all of the compiled codewords.

In some configurations, the storage device includes a remote server of a distributed system communicating with a user device. The plurality of images may occur in response to an upload from a user device, the upload associated with a backup functionality for media content of the user device. The received plurality of images may include a high-quality format and entropy encoding the plurality of images may compress the received plurality of images into a lower-storage footprint format.

In some examples, each image of the plurality of images has a common characteristic where the common characteristic is associated with a particular user, user account, media content album, or physical storage location. Receiving the plurality of images may include receiving media content including the plurality of images and another plurality of images for storage at the storage device and determining that the plurality of images has a common characteristic where the common characteristic is associated with a particular user, user account, media content album, or physical storage location. Additionally or alternatively, the method may further include storing the plurality of images entropy encoded using the generated entropy coding table in a separate location from the other plurality of images at the storage device.

Optionally, the operation of receiving the plurality of images includes detecting a creation or a receipt of media content at a user device running a storage application communicating with the storage device and generating a prompt for the user device where the prompt inquires whether a use of the user device wants to backup or to transfer the detected media content to the storage device. When the user selects to backup or to transfer the detected media content to the storage device, the method includes identifying the plurality of images within the media content for entropy encoding.

In some examples, the plurality of images corresponds to a first subset of images from an upload of media content by a user device. Here, the upload of media content includes the first subset of images and a second subset of images. The first subset of images has a first media content format designated for compression into a lower-storage footprint format. The second subset of images bypasses compression into the lower-storage footprint format.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Media content storage has led to widespread adoption of multimedia compression techniques. These techniques may be employed on almost all types of hardware and software systems to reduce the size of an image and/or a video. Storage providers often employ compression techniques to provide cost effective storage solutions for media content users or media content owners. Compression techniques generally seek to reduce a size of a piece of media content (e.g., an image or a video) while maintaining some degree of quality. Because a media content user or a media content owner may have an interest in maintaining the best quality for his or her media content, this interest may demand large amounts of storage space. Unfortunately, these interests do not entirely align with storage providers who want to utilize their storage space effectively while attempting to minimize the cost to store media content. In other words, large, high-quality media content can be expensive to store and may reduce a number of customers (e.g., media content users or media content owners) invested in the storage provider. As a result, storage providers desire to optimize storage across their entire storage space or portions of their storage space. Yet compression techniques have historically been developed to optimize the compression of content on a per image or a per video basis such that these techniques do not account well for multiple images or videos on a larger scale. Here, to address this issue, a compression technique considers multiple images or videos during the compression process.

Figure 1:
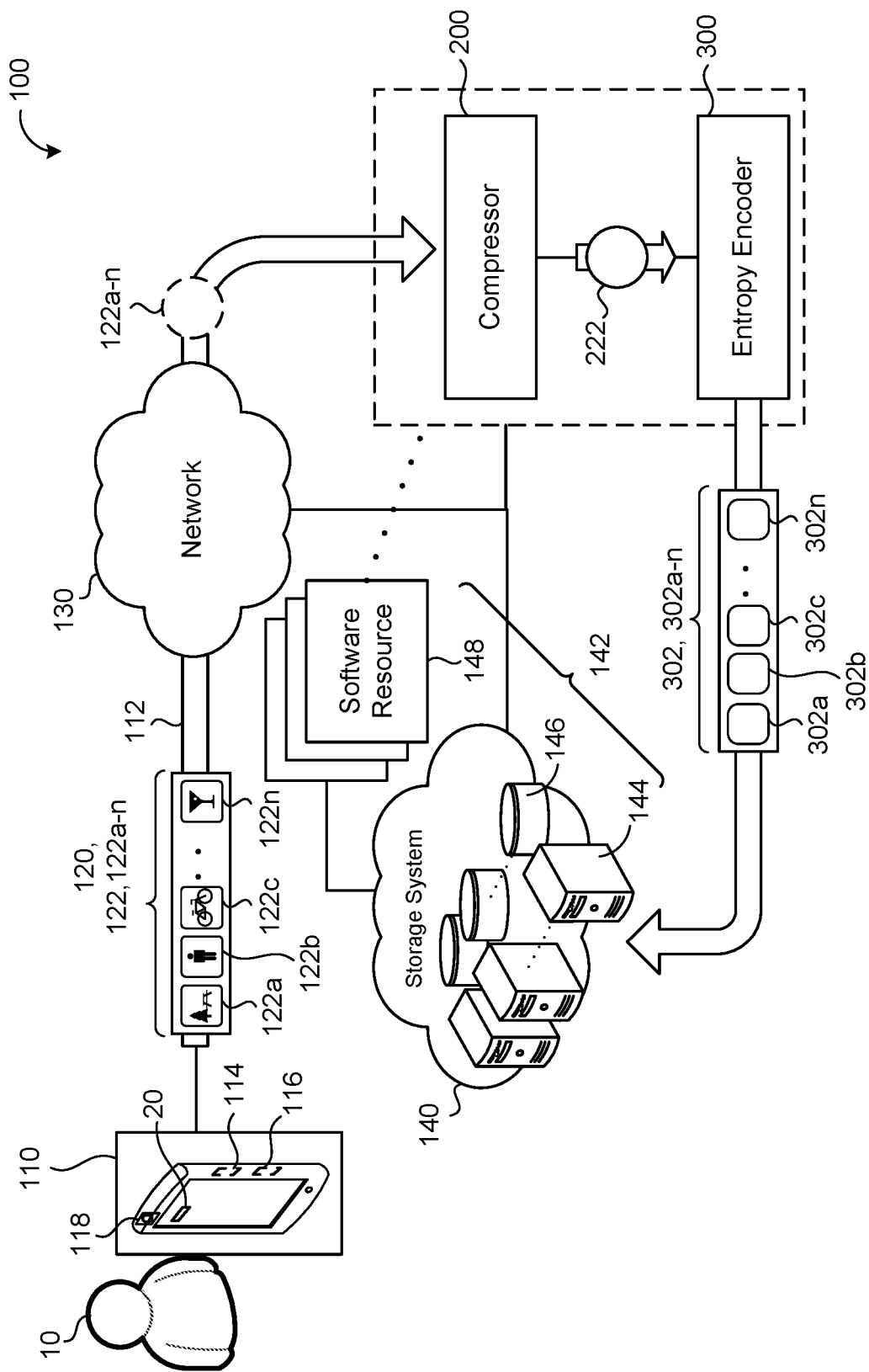
FIG. 1 is a schematic view of an example media storage environment.

FIG. 1 is an example of a media storage environment 100. The media storage environment 100 is an environment where a user 10 communicates via a user device 110 to store media content 120 such as photos (e.g., images 122, 122a-n) or videos. The user 10 may generate an upload 112 of the media content 120 to transfer the media content 120 across a network 130 to a storage system 140. The network 130 may be any type of communication network configured to route data between a user device 110 and the storage system 140. Although FIGS. 1-3 may depict the media content 120 for illustrative purposes as images 122, the media content 120 within the media storage environment 100 may be any type of media content 120 including but not limited to images (e.g., live photos, motion photos, smart burst photos, etc.) or video.

The user 10 may choose to store the media content 120 on the storage system 140 for a variety of reasons. One possible reason is that that the user 10 may be resource conscientious with respect to the user device 110. In other words, the user 10 may choose to store media content 120 on the storage system 140 to consolidate or to minimize resource space of the user device 110 occupied by the media content 120. For instance, the user device 110 is configured with a finite amount of storage space. Depending on the computing resources of the user device 110 (e.g., data processing hardware 114 and/or memory hardware 116), the user 10 may rather allocate computing resources to run applications or other functionality of the user device 110 than store media content 120. Accordingly, the user 10 may choose to store media content 120 in a remote location such as the storage system 140 rather than on the user device 110.

Another reason the user 10 may use the storage system 140 to store media content 120 may be to use media content services associated with the storage system 140. These media content services of the storage system 140, for example, may be offered by a media content application (e.g., a cloud-based application). A cloud-based application generally refers to an application using or having access to computing resources or storage resources of a remote system. For example, a media content application is configured to enable the user 10 (e.g., through the user device 110) to access the storage system 140. In some implementations, the media content application is an application 20 running on the user device 110 that has access to resources (e.g., data processing hardware 114 and/or memory hardware 116) of the user device 110. With access to resources of the user device 110, the application 20 may communicate media content 120 located on the user device 110 to the storage system 140. A media content application may offer media content services for media content 120 prior to, during, or after transfer to the storage system 140. Some examples of media content services include media organization (e.g., photo albums, timelines, geo-tagging, metadata creation/editing), media editing, media sharing capabilities (e.g., peer-to-peer media sharing), media storage, etc. Additionally or alternatively, some of these media content applications may specialize in storage based on various compression techniques or storage management.

In some examples, media content applications offer backup functionality for media content 120 of the user device 110. This backup functionality may be automatic, manual, or customizable by the user 10. Because the user device 110 may be capable of media content generation or acquisition (i.e., receiving media content 120), the backup functionality may allow the user 10 to preserve media content 120. Furthermore, the storage system 140, by offering backup functionality, may simplify media content management for the user 10. For example, the storage system 140 stores the media content 120 in albums (i.e., groups of images 122a-n or videos) or metadata of the media content 120 (e.g., timestamps) to allow the user 10 to conveniently access or to navigate through media content 120.

The user device 110 may be any computing device or data processing hardware capable of communicating captured media content 120 to a network 130 and/or storage system 140. For instance, the user device 110 is a mobile device such as mobile phone, laptop, tablet, personal digital assistant (PDA), smart-wearable (e.g., smartwatch), etc. In some examples, the user device 110 includes data processing hardware 114, memory hardware 116, and at least one image capturing device 118. In other examples, the user device 110 includes data processing hardware 114 and memory hardware 116 without an image capturing device 118 such that the user device 110 is capable of sending and receiving media content 120, but not generating media content 120. The image capturing device 118 is capable of capturing an image 122 or a sequence of images 122a-n (e.g., a video). For example, the image capturing device 118 is a camera configured to capture a single image 122 or multiple images 122a-n at a particular frequency to form video content. By capturing an image 122 or a sequence of images 122a-n, the image capturing device 118 generates media content 120.

The storage system 140 (also referred to as a storage device) generally refers to a networked system remote from the user 10 and/or user device 110 configured to store media content 120. Here, the user 10 does not have physical access to the storage system 140, but has remote access by means of the user device 110 with a network connection to the network 130. The storage system 140 may be one or more workstations and/or servers with one or more network addresses. The storage system 140 includes resources 142, such as data processing hardware 144, memory hardware 146, and software resources 148. In some examples, the storage system 140 is a distributed system (e.g., a cloud environment) where resources 142 may be shared across a number of computing systems.

Referring in further detail to FIG. 1, the user 10 may decide to backup media content 120 located on the user device 110. To back up the media content 120, the user 10 may upload media content 120 (e.g., at least one image 122) to the storage system 140. Here, FIG. 1 depicts a plurality of images 122a-n uploaded by the user 10 at the user device 110. In some examples, the user 10 manually generates the upload 112 of media content 120 (e.g., images 122a-n). In other examples, the application 20 executing on the user device 110 automatically generates the upload 112 of media content 120 (e.g., images 122a-n). For example, the application 20 initiates an auto-backup process (e.g., at a particular time or particular threshold of storage and/or generation of media content 120) that generates the upload 112 of media content 120 (e.g., images 122). In some configurations, the application 20 is configured to detect creation or receipt of media content 120 at the user device 110 (e.g., by the image capturing device 118). When the application 20 detects creation (or receipt) of media content 120, the application 20 may prompt the user 10 of the user device 110 to backup (e.g., copy) the created media content 120 and/or to transfer the media content 120 to the storage system 140. The application 20 may be configured to automatically backup and/or to automatically transfer created media content when the application 20 detects media content creation at the user device 110.

FIG. 1 illustrates that when the media content 120, such as images 122a-n, are communicated to the storage system 140, a compressor 200 and an entropy encoder 300 process the media content 120 into compressed media content for storage (e.g., shown as compressed images 302, 302a-n). The compressor 200 and the entropy encoder 300 may correspond to software resources 148 on the storage system 140. In some examples, the storage system 140 receives the media content 120 (e.g., images 122a-n) and then communicates the media content 120 to the compressor 200 and the entropy encoder 300. As an example of the media content 120 as images 122a-n, the user 10 may upload the images 122a-n in a high-quality format (e.g., raw format) and the storage system 140 may subsequently recompress the uploaded images 122a-n (to a Joint Photographic Experts Group (JPEG) format) using the compressor 200 and the entropy encoder 300. In other examples, the compressor 200 and the entropy encoder 300 process the media content 120 prior to the user device 110 uploading the media content 120 to the storage system 140. Here, functionality of the compressor 200 and the entropy encoder 300 may execute on the user device 110 via the application 20 running on the user device 110. For instance, once the media content 120 (e.g., images 122a-n) is designated by the user device 110 (e.g., via the application 20) for upload at the user device 110, the compressor 200 and the entropy encoder 300 may process the media content 120 prior to uploading the media content 120. When the compressor 200 and the entropy encoder 300 process the media content 120 (e.g., images 122a-n) designated for upload 112 to the storage system 140, the user device 110 may upload 112 the media content 120 at a compressed size, thereby enabling faster upload times while requiring less bandwidth during the upload 112. Regardless of whether the media content 120 is designated for upload 112 or whether the upload is complete, the compressor 200 and the entropy encoder 300 are configured to process the media content 120 (e.g., images 122a-n) to generate compressed media content (e.g., shown as compressed images 302a-n) for storage on the storage system 140.

Without processing the media content 120 by the compressor 200 and the entropy encoder 300 into corresponding compressed media content 120, the storage of the media content 120 (e.g., images 122a-n) may be costly for the storage provider of the storage system 140 because the user 10 may designate and upload the media content 120 in a high quality format. Particularly, when the user 10 designates and uploads the media content 120 in a high quality format, the storage provider may be forced to store media content 120 that occupy more space than if the media content 120 is compressed into the corresponding compressed media content 120 (e.g., compressed images 302a-n) prior to storage on the storage system 140. Accordingly, as more and more users 10 of user devices 110 are using storage systems 140 to store their media content 120, storage providers may provide cost effective storage solutions utilizing the compressor 200 and the entropy encoder 300. For instance, using the compressor 200 and the entropy encoder 300, media content 120 (e.g., images 122a-n) of a high quality format may be compressed to compressed media content (e.g., images 302a-n) of a lower-storage footprint format to reduce storage requirements at the storage system 140. Moreover, when the media content 120 is compressed by the compressor 200 and the entropy encoder 300 prior to being uploaded to the storage system 140, upload times and bandwidth requirements are reduced.

When the compressor 200 receives the media content 120, the compressor 200 is configured to perform lossy compression and to generate an output of quantization indices 222. Here, the entropy encoder 300 receives the output of the quantization indices 222 and is configured to entropy encode the media content 120 in a lossless process according to one or more entropy coding tables 322 (e.g., shown in FIG. 3) to form the compressed media content 120 (e.g., shown as compressed images 302, 302a-n). In some examples, the compressor 200 and the entropy encoder 300 are separate components (e.g., separate software programs). As separate components, the compressor 200 and the entropy encoder 300 are configured to communicate with each other, but may be implemented at different locations within media storage environment 100. In some implementations, as shown by the dotted box in FIG. 1, the compressor 200 and the entropy encoder 300 include a single unit. For example, the compressor 200 and the entropy encoder 300 are part of a single program executing on a media storage application associated with the storage system 140. In other words, the media storage application may be a software resource 148 of the storage system 140 used to communicate with the user device 110 that includes the compressor 200 and the entropy encoder 300 as built-in functionality.

Figure 2:
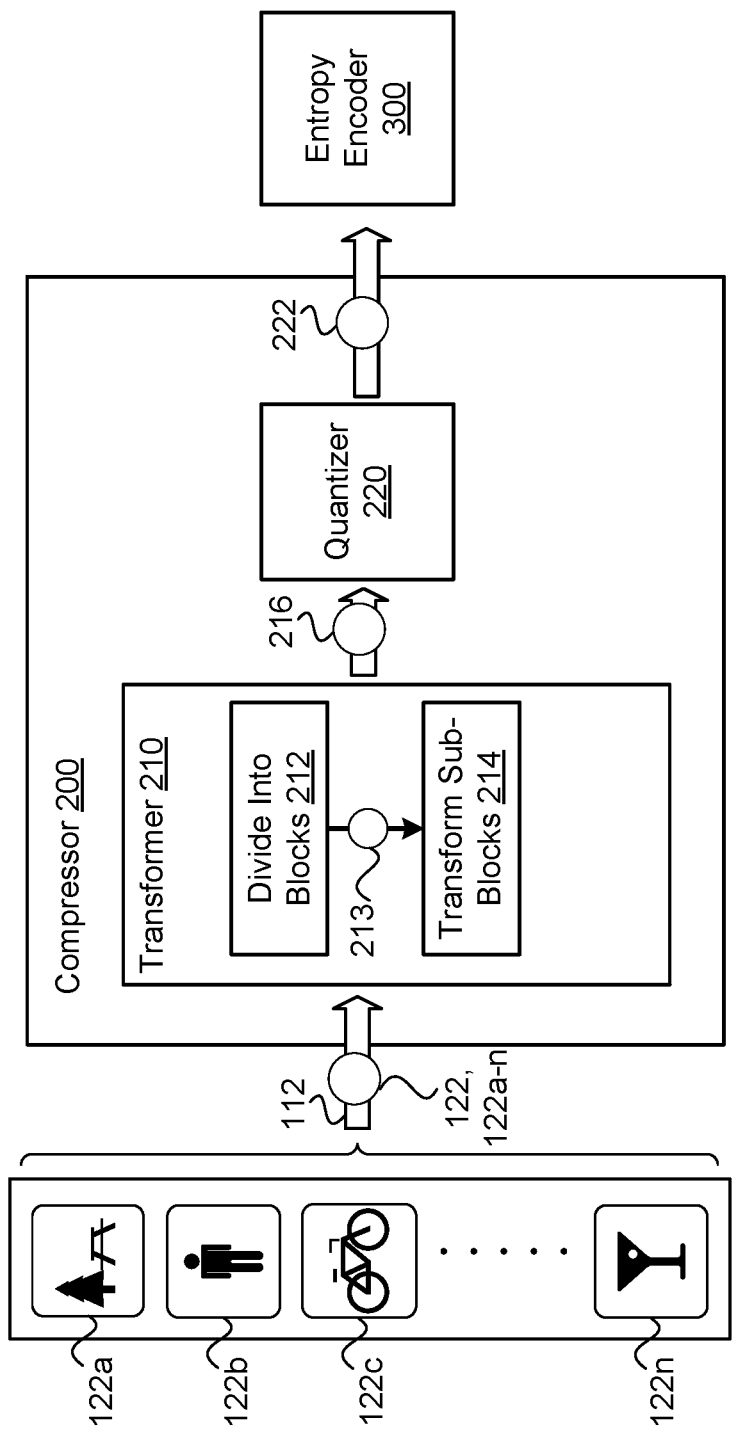
FIG. 2 is a schematic view of an example compressor of the media storage environment of FIG. 1.

FIG. 2 is an example of a compressor 200. The compressor 200 is configured to perform lossy compression (e.g., JPEG compression) of the media content 120 (e.g., shown as the plurality of images 122a-n) from the upload 112. Lossy compression is a form of media compression that processes media content (e.g., an image 122) to reduce an amount of data required to represent the media content 120. In order to reduce the amount of data required to represent the media content 120, lossy compression often removes redundant information or information that a compression technique designates as unnecessary for representation of the media content 120. Redundant information may be coding redundancies, inter-pixel redundancies, or psycho-visual redundancies. By removing redundancies, the lossy compression forms media content 120 (e.g., a compressed image 302) that includes less data (i.e., compressed) than an original form of the media content 120 (e.g., image 122) prior to compression yet often with an imperceptible loss in quality to the user 10. This is because compression algorithms reduce redundancies by accounting for an actual perception of quality by a human eye (i.e., information that cannot be detected by the human eye). For example, the human eye is more sensitive to luminance than to chrominance and, accordingly, compression techniques often discard chrominance information.

The compressor 200 generally includes a transformer 210 and a quantizer 220. In some examples, the compressor 200 includes additional or alternative components depending on a type of lossy compression that occurs at the compressor 200. The transformer 210 is configured to receive the media content 120 (e.g., shown as images 122a-n) from the upload 112 of the user device 110. With reference to FIG. 2, for each image 122, the transformer 210, at operation 212, partitions/divides the image 122 into sub-blocks (e.g., pixel blocks) 213. For example, the transformer 210 partitions/divides the image 122 into 8×8 pixel blocks 213. With each sub-block 213, at operation 214, the transformer 210 transforms the sub-block 213 to generate corresponding transform coefficients 216 (e.g., by discrete cosine transform (DCT)). For example, with an 8×8 sub-block, the sub-block 213 is effectively a 64-point discrete signal in two spatial dimensions. As such, in the case of DCT transformation of an 8×8 sub-block 213, the DCT transformation transforms the 64-point discrete signal into a decomposition of sixty-four spatial frequencies to output a set of sixty-four signal amplitudes as the transform coefficients 216. These transform coefficients 216 may have some coefficients with zero frequency in both dimensions (also referred to as a DC coefficient) and some coefficients with non-zero frequencies (also referred to as an AC coefficient). Here, lower-numbered coefficients represent low-frequency color change (i.e., gradual color change across a region) while high-numbered coefficients represent high-frequency color change (i.e., a rapid change from one pixel to another within a block). In some examples, the transform coefficients 216 are a non-quantized form of symbols that represent the media content 120 (e.g., the image 122). By generating transform coefficients 216, the transformer 210 may correlate redundant image data and non-redundant image data to aid in the removal of redundant image data by the entropy encoder 300. In some implementations, the transform coefficients 216 also allow the entropy encoder 300 to easily determine a number of coefficients per transform sub-block 213 with non-zero variance to aid codeword generation. Once the transformer 210 generates the transform coefficients 216, the transformer 210 communicates the transform coefficients 216 to the quantizer 220.

In some examples, the transformer 210 performs additional operations. These operations may involve media content preparation. In some configurations, operations of media content preparation occur prior to the transformer 210 dividing the media content 120 into sub-blocks 213 at operation 212. For media content preparation, the transformer 210 may separate the media content 120 into components of a color space (e.g., luminance (Y), blue chrominance (U), and red chrominance (V)). When the transformer 210 separates the media content 120 (e.g., image 122) into color space components, the transformer 210 may additionally subsample the color space components (e.g., chrominance components) by pixel region.

The quantizer 220 receives the transform coefficients 216 and is configured to perform a quantization process (e.g., scalar quantization) based on the transform coefficients 216. A quantization process generally converts input parameters into a smaller data set of output values. Although a quantization process may convert from analogue into digital, here, the quantization process processes digital content of transformed digital media content. By using a quantization process, data may be compressed, but at a cost of some aspect of data loss since the smaller data set is a reduction of a larger or continuous data set (i.e., a lossy process). The quantizer 220 quantizes (e.g., scalar quantizes) the transform coefficients 216 of each sub-block 213 from the transformer 210 into quantization indices 222. As an example, the quantizer 220 divides each transform coefficient 216 by a corresponding quantizer step size and then may subsequently round a resulting value to a nearest integer to form the quantization indices 222. Here, the quantization indices 222 are communicated to the entropy encoder 300 for codeword formation and entropy encoding. In some examples, quantizing by scalar quantization of the transform coefficients 216 may allow a lossy compression process at the compressor 200 to scale each transform coefficient 216 in order to contrast redundant media content data (e.g., data that may be removed during encoding) to valuable media content data (e.g., data that to should not be removed).

In some examples, a quantization table specifies the quantizer step size for the quantizer 220. The quantization table may be a default quantization table based on a compression format (e.g., a desired quality setting) or custom quantization table based on a purpose of lossy compression (i.e., a compression application). In some configurations, the quantizer step size dictates whether the transform coefficients 216 receive fine quantization and/or course quantization or, in some cases, which transform coefficients 216 receive fine quantization and which receive course quantization. Fine quantization often more closely resembles the original image while course quantization forms a less accurate resemblance of the original image. Since quantization tables may differ for different compression applications, compressed media content (e.g., compressed image 302) may store the quantization table used during quantization to enable decompression.

Figure 3:
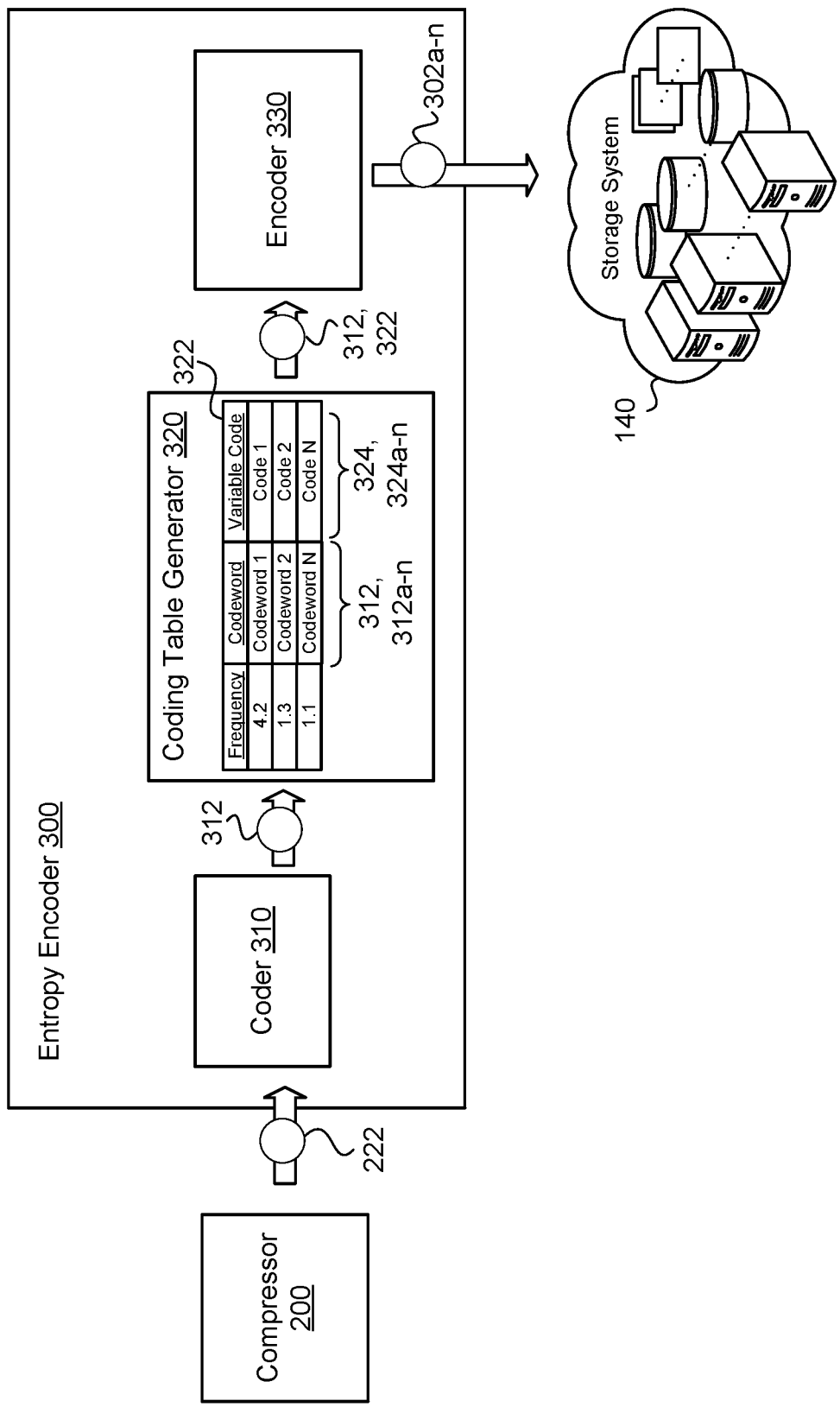
FIG. 3 is a schematic view of an example entropy encoder of the media storage environment of FIG. 1.

Referring to FIG. 3, the entropy encoder 300 receives, from the compressor 200, the quantization indices 222 for the plurality of images 122a-n from the lossy compression. With the quantization indices 222 for the media content 120 (e.g., the plurality of images 122a-n), the entropy encoder 300 is configured to encode the media content 120 into corresponding compressed media content (e.g., shown as compressed images 302a-n). As shown in FIG. 3, the entropy encoder 300 generally includes a coder 310, a coding table generator 320, and an encoder 330. The coder 310 is configured to generate codewords 312 based on the quantization indices 222. Codewords 312 refer to a string of bits used to represent symbols of data (e.g., bits, bytes, transform coefficients, quantized transform coefficients, quantization indices, vectors, etc.). In other words, these symbols may represent the compression-based data from the compressor 200. In some implementations, the coder 310 orders the quantization indices 222 to perform run-length encoding (RLE). For instance, the coder 310 may order the quantization indices 222 using a zig-zag sequence (e.g., in sequential encoding) and then use a run-length coding algorithm on the zig-zag sequence to generate symbols. For example, the RLE performs a linear transformation of a matrix of quantization indices 222 to vectorize the quantization indices into symbols having a vector form. To illustrate for an 8×8 sub-block 213, the symbols of the codewords 312 correspond to a vector representing sixty-four quantization indices 222 ordered according to the zig-zag sequence. In other examples, the coder 310 employs part or all of progressive encoding (e.g., progressive encoding corresponding to progressive JPEG) where instead of a sequential pattern (e.g., the zig-zag sequence) the coder 310 scans similar positioned quantization indices 222 in batches to generate the symbols.

In some configurations, during RLE, the coder 310 generates codewords 312 that represent the quantization indices 222 by consolidating consecutive zero quantization indices 222 and coding non-zero quantization indices 222. For example, each codeword 312 is formed from a combination of two symbols, a first symbol and a second symbol. The first symbol represents a run-length (i.e., a number of zeros in the quantization indices 222 before a non-zero quantization index 222) and a size corresponding to a number of bits that represent a non-zero quantization index 222 succeeding the run-length of zero quantization indices 222. The second symbol represents an amplitude corresponding to the non-zero quantization index 222 of the first symbol. To illustrate, with a vector representing sixty-four quantization indices 222 for an 8×8 sub-block 213, the vector may include a sequence of quantization indices 222, such as (41, 0, 0, 0, 67, . . . ). Here, the coder 310 may represent this sequence as (0, 41); (3, 67) since there are no zero quantization indices 222 before the non-zero quantization index 222 of forty-one (41) and there are three zero quantization indices 222 before the non-zero quantization index 222 of sixty-seven (67). With symbols for the quantization indices 222, the coder 310 forms codewords 312 defined by a bit string. In some examples, the coder 310 forms codewords 312 where each codeword is a fixed-length bit string representing the quantization indices 222 (e.g., the quantized transform coefficients). For example, each codeword 312 is coded as a 4-bit value. In some examples, there are special codewords 312 that correspond to an end of a block (e.g., an end of block marker) or a max run-length of zeros for a fixed-length bit string. For instance, in the case of 4-bit values, the max run-length special codeword 312 corresponds to sixteen consecutive zeros. The codewords 312 generated by the coder 310 may correspond to each symbol (e.g., run-length representation, or non-zero quantization indices 222 representation). Once the coder 310 generates the codewords 312, the codewords 312 may be communicated to the coding table generator 320.

The coding table generator 320 generates one or more entropy coding tables 322 based on the codewords 312 received from the coder 310. Traditionally, during entropy encoding based on lossy compression (e.g., JPEG compression), the entropy encoding uses either standard entropy coding tables or entropy coding tables optimized for a single element of media content 120. For instance, the lossy compression generates codewords for a single image and the entropy encoder 300 encodes solely based on the generated codewords from the single image. This process may be a combination of lossy compression and entropy encoding that results in compressed media content, but, unfortunately, this compression process lacks optimization for total storage across all of the media content (e.g., images 122a-n or a set of images 122a-n from an upload 112) and/or lacks specific optimization for a particular set of multiple elements of media content. More specifically, generally, entropy coding tables do not account for multiple elements of media content (i.e., generate an entropy coding table across multiple images). Although standard entropy coding tables may be based on average statistics of a large set of images with a particular bit precision, these tables are not unique to, for example, a particular plurality of images 122a-n (e.g., a particular set of images 122a-n to be stored in a storage system 140) and, thus, may cause storage inefficiencies for storage providers. By accounting for multiple elements of media content 120 (e.g., multiple images 122a-n) that will or are definitively stored at the storage system 140 when generating the entropy coding tables, the compressor 200 and entropy encoder 300 may optimize media content storage for the storage provider; thus, potentially reducing storage costs or stabilizing storage costs for the user 10.

In some examples, the compressor 200 and/or the entropy encoder 300 are configured to optimize storage across different collections or sets of media content 120. In these examples, the media content 120 may share a common characteristic. For example, the compressor 200 and/or the entropy encoder 300 are configured to optimize storage for the media content 120 associated with one or more users 10 (e.g., a user account of a user 10 with an application 20 and/or storage system 140). On a different scale, the compressor 200 and/or the entropy encoder 300 may be configured to optimize storage across one or more subsets of media content 120, such as a media content album or a collection of media content sharing a given metadata characteristic. In some configurations, an application 20 and/or storage system 140 employ the compressor 200 and/or entropy encoder 300 to optimize storage for some (e.g., a specific physical storage location) or all of a storage system 140 (e.g., an entire remote system or datacenter). The application 20 and/or storage system 140 may identify a common characteristic of the media content (e.g., a type of media content 120 or a designated storage location of the media content 120) and determine whether the identification will utilize the compressor 200 and/or the entropy encoder 300. For example, the application 20 and/or storage system 140 may identify that some or all of the uploaded media content shares a common characteristic and communicate the media content with the common characteristic to the compressor 200 and/or the entropy encoder 300.

In some configurations, media content 120 of the upload 112 includes media content elements with different quality formats such that the plurality of images 122a-n may correspond to a subset of images 122a-n of the upload 112. For instance, the subset of images 122a-n defining the plurality of images 122a-n for the compressor 200 and/or entropy encoder 300 corresponds to images of the upload 112 with large (e.g., high) quality formats. In this configuration, the compressor 200 and/or entropy encoder 300 may identify the quality differences of the media content 120 and determine the subset of images 122a-n to be processed. In other words, some media content 120 of the upload 112 may be compressed into a lower-storage format (e.g., the identified subset of images 122a-n) while non-identified media content 120 is stored in the storage system 140 (e.g., without processing by the compressor 200 and/or entropy encoder 300).

Additionally or alternatively, the storage provider of the storage system 140 and/or application 20 designates media content formats that will be processed by the compressor 200 and/or entropy encoder 300. For instance, the application 20 (or compressor 200 and entropy encoder 300) may be programmed with a file size threshold indicating a minimum file size to be compressed into a lower-storage footprint format. In some examples, the application 20 is configured to categorically designate media content formats to be compressed by the compressor 200 and/or entropy encoder 300 into a lower-storage footprint format.

With continued reference to the entropy encoder 300 of FIG. 3, the coding table generator 320 receives codewords 312 for a plurality of images 122a-n (e.g., the media content 120 of the upload 112). In some examples, the coding table generator 320 regenerates an entropy coding table 322 for a storage provider or storage system 140 each time more media content 120 is communicated to the storage system 140 such that the storage system 140 maintains storage efficiency across all stored media content. In some implementations, the coding table generator 320 generates a coding table 322 only for the plurality of images 122a-n sent together to the compressor 200 and/or entropy encoder 300 (e.g., by upload 112).

In some examples, an entropy coding table 322 is a bit string map that includes one or more codewords 312, a frequency of occurrence for each codeword 312, and a variable-length bit string (e.g., shown as a variable code 324) mapped to each codeword 312. In some configurations, the frequency of occurrence corresponds to a count of a number of times a particular codeword 312 exists in the media content 120 (e.g., the plurality of images 122a-n) such that the coding table generator 320 compiles each codeword 312 by a corresponding frequency of occurrence. For instance, FIG. 3 depicts codewords 312a-n ordered by frequency from most frequent (4.2) to least frequent (1.1). In some examples, variable-length bit strings map to fixed-length bit strings such that codewords 312 with a greater frequency map to variable-length bit strings with less bits. For example, when a codeword 312 appears at the greatest frequency compared to other codewords 312, the coding table generator 320 assigns a variable-length bit string (e.g., shown as a variable code 324 in FIG. 3) with the least amount of bits. In other words, when the coding table generator 320 assigns a first variable-length code 324a to a first codeword 312a and a second variable-length code 324b to a second codeword 312b, the first variable-length code 324a includes less bits than the second variable-length code 324b because the first codeword 312a has a greater frequency of occurrence than the second codeword 312b. In some examples, a range of frequencies may be assigned a particular variable-length bit string such that even though two codewords 312 (e.g., the first codeword 312a and the second codeword 312b) have different frequencies, each of these codewords 312a-n has a corresponding variable-length code 324a-n of different bits, but of the same variable-length bit string. By assigning a variable-length bit string (e.g., a variable-length code 324) with an amount of bits proportional to a frequency of occurrence for the fixed-length bit string (e.g., codeword 312), the coding table generator 320 may ensure that a representation of the media content 120 (e.g., image 122) according to a variable length bit string is likely to decrease a number of bits required to form the compressed media content (e.g., compressed image 302). In other words, a sum of a length of bits of the variable-length bit string may be optimized.

The encoder 330 uses the entropy coding table 322 generated by the coding table generator 320 to perform entropy encoding resulting in a compressed version (e.g., compressed images 302a-n) of the media content 120. Entropy encoding may refer to a lossless data compression process because entropy encoding may allow for original data to be perfectly reconstructed from compressed data. The encoder 330 receives the codewords 312 for the media content 120 (e.g., images 122a-n) and the entropy coding table 322 and replaces each codeword 312 within the media content 120 (e.g., images 122a-n) with a corresponding variable-length code 324a-n as designated by the entropy coding table 322. For this process, the encoder 330 may, in conjunction with the entropy coding table(s) 322, use entropy encoding techniques such as Huffman coding or arithmetic coding. These entropy encoding techniques may define the size of the variable-length codes 324 to be mapped to the codewords 312 (e.g., according to frequency) as indicated by the entropy coding table(s) 322.

Figure 4:
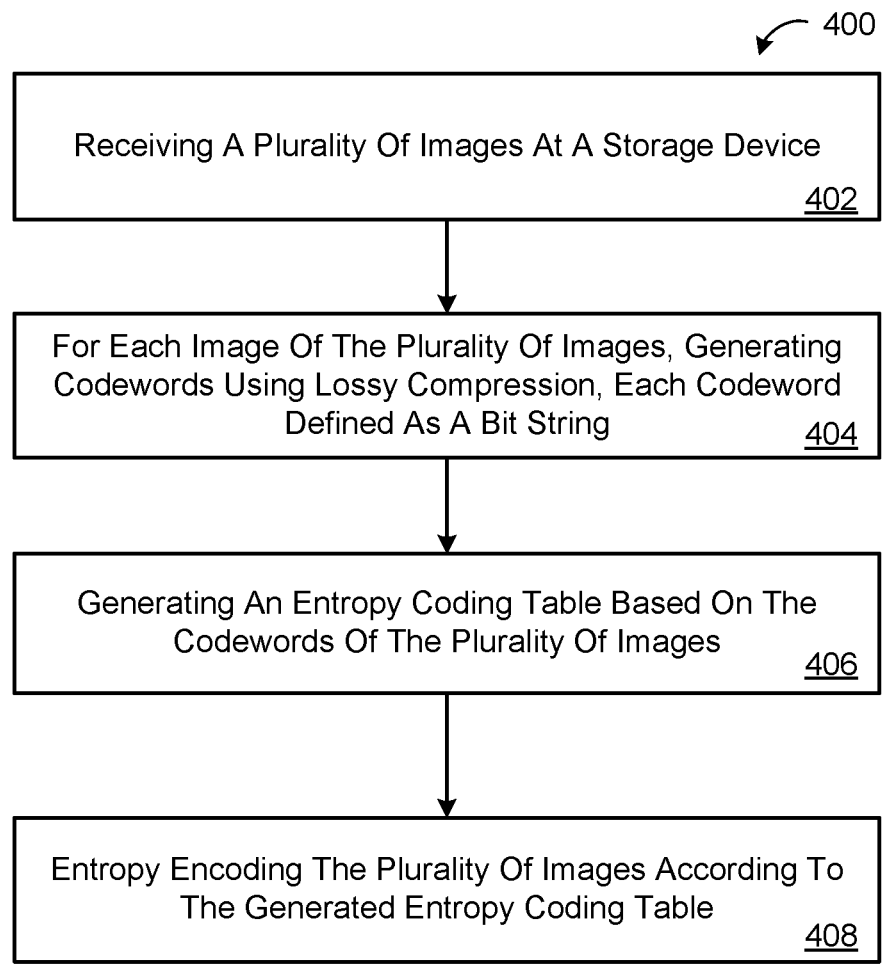
FIG. 4 is a flow diagram of an example arrangement of operations for a method of implementing image compression for a storage system of a media storage environment.

FIG. 4 is a flow diagram of an example method 400 for generating compressed media content for storage at a storage system 140 where the compressed media content is compressed images 302, 302a-n. At operation 402, the method 400 receives a plurality of images 122, 122a-n at a storage device (e.g., the storage system 140 (e.g., memory hardware 146 at the storage system 140)). At operation 404, for each image 122 of the plurality of images 122, the method 400 generates codewords 312 using lossy compression. Here, each codeword 312 is defined as a bit string. At operation 406, the method 400 generates an entropy coding table 322 based on the codewords 312 of the plurality of image 122. At operation 408, the method 400 entropy encodes the plurality of images 122 using the generated entropy coding table 322. In some implementations, the user device 110 executes an application 20 configured to implement the functionality of the compressor 200 and/or the entropy encoder 300 on the user device 110. In these implementations, the user device 200 locally stores the plurality of images 122 and perform operations 404, 406, 408 locally to encode the plurality of images 122 locally. The user device 110 may then upload the encoded images as compressed images 302 for storage on the storage device (e.g., the storage system 140).

In some implementations, the plurality of images 122a-n indicates a portion of the media content 120 that will be entropy encoded according to an entropy coding table 322 based specifically on the collective of the plurality of images 122a-n. In other words, the plurality of images 122a-n may be formed as a subset of the media content 120, but the plurality of images 122a-n are all entropy encoded collectively such that there is not a single image of the plurality of images 122a-n that bypasses entropy encoding.

Figure 5:
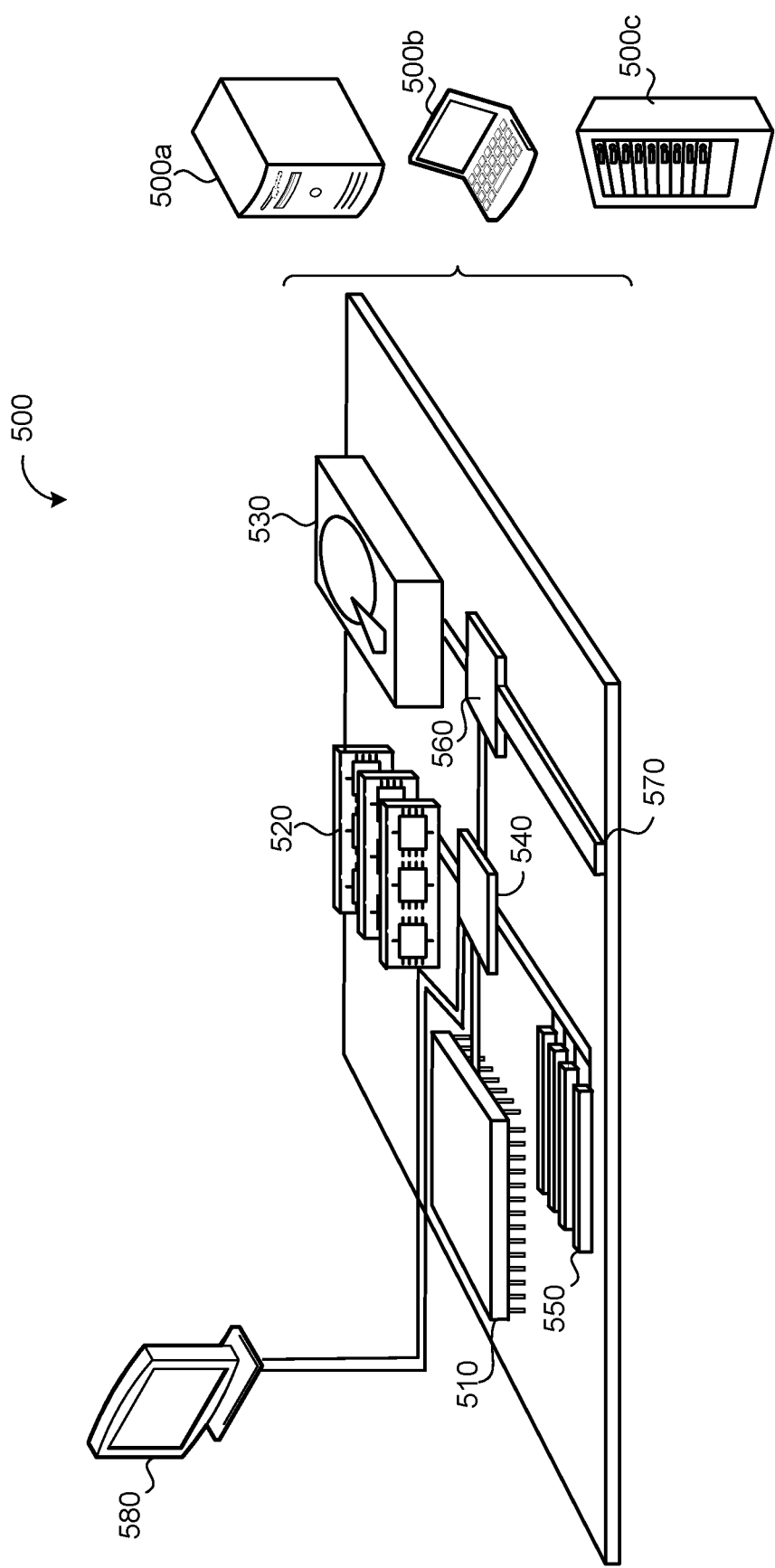
FIG. 5 is a schematic view of an example computing device that may be used to implement the systems and method described herein.

FIG. 5 is schematic view of an example computing device 500 that may be used to implement the systems (e.g., the user device 110, the storage system 140, the compressor 200, and/or the entropy encoder 300) and methods (e.g., method 400) described in this document. The computing device 500 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 500 includes a processor 510 (e.g., data processing hardware), memory 520 (e.g., memory hardware), a storage device 530, a high-speed interface/controller 540 connecting to the memory 520 and high-speed expansion ports 550, and a low speed interface/controller 560 connecting to a low speed bus 570 and a storage device 530. Each of the components 510, 520, 530, 540, 550, and 560, are interconnected using various busses, and may be mounted on a common motherboard or in other manners as appropriate. The processor 510 can process instructions for execution within the computing device 500, including instructions stored in the memory 520 or on the storage device 530 to display graphical information for a graphical user interface (GUI) on an external input/output device, such as display 580 coupled to high speed interface 540. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 520 stores information non-transitorily within the computing device 500. The memory 520 may be a computer-readable medium, a volatile memory unit(s), or non-volatile memory unit(s). The non-transitory memory 520 may be physical devices used to store programs (e.g., sequences of instructions) or data (e.g., program state information) on a temporary or permanent basis for use by the computing device 500. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 530 is capable of providing mass storage for the computing device 500. In some implementations, the storage device 530 is a computer-readable medium. In various different implementations, the storage device 530 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 520, the storage device 530, or memory on processor 510.

The high speed controller 540 manages bandwidth-intensive operations for the computing device 500, while the low speed controller 560 manages lower bandwidth-intensive operations. Such allocation of duties is exemplary only. In some implementations, the high-speed controller 540 is coupled to the memory 520, the display 580 (e.g., through a graphics processor or accelerator), and to the high-speed expansion ports 550, which may accept various expansion cards (not shown). In some implementations, the low-speed controller 560 is coupled to the storage device 530 and a low-speed expansion port 590. The low-speed expansion port 590, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 500a or multiple times in a group of such servers 500a, as a laptop computer 500b, or as part of a rack server system 500c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
    receiving, at data processing hardware, a plurality of images at a storage device;
    for each image of the plurality of images, generating, by the data processing hardware, codewords using lossy compression, each codeword defined as a bit string;
    generating, by the data processing hardware, an entropy coding table specific to the codewords generated for each image of the plurality of images received at the storage device, the entropy coding table configured to adapt to different sets of images received at the storage device; and
    entropy encoding, by the data processing hardware, the plurality of images using the generated entropy coding table that is specific to the plurality of images received at the storage device.

2. The method of claim 1, wherein generating codewords further comprises:
    dividing each image of the plurality of images into pixel blocks;
    transforming each of the pixel blocks into transform coefficients;
    quantizing the transform coefficients to form quantization indices;
    representing each quantization index as a respective bit string; and
    assigning a variable-length code to the respective bit string, the variable-length code comprising a length of bits that decreases when an occurrence of the respective bit string increases within the plurality of images.

3. The method of claim 2, wherein the transform coefficients comprise discrete cosine transform (DCT) coefficients.

4. The method of claim 1, wherein the lossy compression comprises Joint Photographic Experts Group (JPEG) compression.

5. The method of claim 1, wherein generating the entropy encoding table comprises:
   compiling the codewords generated for each image of the plurality of images based on frequencies of occurrence of the codewords, the frequencies of occurrence indicating a number of times each codeword exists in the plurality of images; and
   assigning a variable-length code of bits to each compiled codeword based on the frequencies of occurrence of the codewords.

6. The method of claim 5, wherein assigning the variable-length code of bits to each compiled codeword based on the frequencies of occurrence of the codewords comprises optimizing a sum of the variable-length code of bits for all of the compiled codewords.

7. The method of claim 1, wherein receiving the plurality of images occurs in response to an upload from a user device, the upload associated with a backup functionality for media content of the user device.

8. The method of claim 1, wherein each image of the plurality of images have a common characteristic, the common characteristic being an association with a particular user, user account, media content album, or physical storage location.

9. The method of claim 1, wherein receiving the plurality of images comprises:
   receiving media content comprising the plurality of images and another plurality of images for storage at the storage device; and
   determining that the plurality of images has a common characteristic, the common characteristic being an association with a particular user, user account, media content album, or physical storage location.

10. The method of claim 9, further comprising storing, by the data processing hardware, the plurality of images entropy encoded using the generated entropy coding table in a separate location from the other plurality of images at the storage device.

11. A method comprising:
   receiving, at data processing hardware, a plurality of images at a storage device;
   for each image of the plurality of images, generating, by the data processing hardware, codewords using lossy compression, each codeword defined as a bit string;
   generating, by the data processing hardware, an entropy coding table based on the codewords generated for each image of the plurality of images; and
   entropy encoding, by the data processing hardware, the plurality of images using the generated entropy coding table,
   wherein receiving the plurality of images comprises:
      detecting a creation or a receipt of media content at a user device running a storage application communicating with the storage device;
      generating a prompt for the user device, the prompt inquiring whether a user of the user device wants to backup or to transfer the detected media content to the storage device; and
      when the user selects to backup or to transfer the detected media content to the storage device, identifying the plurality of images within the media content for entropy encoding.

12. A method comprising:
   receiving, at data processing hardware, a plurality of images at a storage device;
   for each image of the plurality of images, generating, by the data processing hardware, codewords using lossy compression, each codeword defined as a bit string;
   generating, by the data processing hardware, an entropy coding table based on the codewords generated for each image of the plurality of images; and
   entropy encoding, by the data processing hardware, the plurality of images using the generated entropy coding table,
   wherein the plurality of images corresponds to a first subset of images from an upload of media content by a user device, the upload of media content comprising the first subset of images and a second subset of images, the first subset of images having a first media content format designated for compression into a lower-storage footprint format, the second subset of images bypassing compression into the lower-storage footprint format.

13. A system comprising:
data processing hardware; and
memory hardware in communication with the data processing hardware, the memory hardware storing instructions that when executed on the data processing hardware cause the data processing hardware to perform operations comprising:
   receiving a plurality of images at a storage device;
   for each image of the plurality of images, generating codewords using lossy compression, each codeword defined as a bit string;
   generating an entropy coding table specific to the codewords generated for each image of the plurality of images received at the storage device, the entropy coding table configured to adapt to different sets of images received at the storage device; and
   entropy encoding the plurality of images using the generated entropy coding table that is specific to the plurality of images received at the storage device.

14. The system of claim 13, wherein generating codewords further comprises:
   dividing each image of the plurality of images into pixel blocks;
   transforming each of the pixel blocks into transform coefficients;
   quantizing the transform coefficients to form quantization indices;
   representing each quantization index as a respective bit string; and
   assigning a variable-length code to the respective bit string, the variable-length code comprising a length of bits decrease when an occurrence of the respective bit string increases within the plurality of images.

15. The system of claim 14, wherein the transform coefficients comprise discrete cosine transform (DCT) coefficients.

16. The system of claim 13, wherein the lossy compression comprises Joint Photographic Experts Group (JPEG) compression.

17. The system of claim 13, wherein generating the entropy encoding table comprises:
   compiling the codewords generated for each of the plurality of images based on frequencies of occurrence of the codewords, the frequencies of occurrence indicating a number of times each codeword exists in the plurality of images; and assigning a variable-length code of bits to each compiled codeword based on the frequencies of occurrence of the codewords.

18. The system of claim 17, wherein assigning the variable-length code of bits to each compiled codeword based on the frequencies of occurrence of the codewords comprises optimizing a sum of the variable-length code of bits for all of the compiled codewords.

19. The system of claim 13, wherein receiving the plurality of images occurs in response to an upload from a user device, the upload associated with a backup functionality for media content of the user device.

20. The system of claim 13, wherein each image of the plurality of images have a common characteristic, the common characteristic being an association with a particular user, user account, media content album, or physical storage location.

21. The system of claim 13, wherein the operation of receiving the plurality of images comprises:
  receiving media content comprising the plurality of images and another plurality of images for storage at the storage device; and
  determining that the plurality of images has a common characteristic, the common characteristic being an association with a particular user, user account, media content album, or physical storage location.

22. The system of claim 21, wherein the operations further comprise storing the plurality of images entropy encoded using the generated entropy coding table in a separate location from the other plurality of images at the storage device.

23. A system comprising:
data processing hardware; and
memory hardware in communication with the data processing hardware, the memory hardware storing instructions that when executed on the data processing hardware cause the data processing hardware to perform operations comprising:
  receiving a plurality of images at a storage device;
  for each image of the plurality of images, generating codewords using lossy compression, each codeword defined as a bit string;
  generating an entropy coding table based on the codewords generated for each image of the plurality of images; and
  entropy encoding the plurality of images using the generated entropy coding table,
  wherein receiving the plurality of images comprises:
    detecting a creation or a receipt of media content at a user device running a storage application communicating with the storage device;
    generating a prompt for the user device, the prompt inquiring whether a user of the user device wants to backup or to transfer the detected media content to the storage device; and
    when the user selects to backup or to transfer the detected media content to the storage device, identifying the plurality of images within the media content for entropy encoding.

24. A system comprising:
data processing hardware; and
memory hardware in communication with the data processing hardware, the memory hardware storing instructions that when executed on the data processing hardware cause the data processing hardware to perform operations comprising:
  receiving a plurality of images at a storage device;
  for each image of the plurality of images, generating codewords using lossy compression, each codeword defined as a bit string;
  generating an entropy coding table based on the codewords generated for each image of the plurality of images; and
  entropy encoding the plurality of images using the generated entropy coding table,
  wherein the plurality of images corresponds to a first subset of images from an upload of media content by a user device, the upload of media content comprising the first subset of images and a second subset of images, the first subset of images having a first media content format designated for compression into a lower-storage footprint format, the second subset of images bypassing compression into the lower storage footprint format.

* * * * *